United States Patent
Groot et al.

(10) Patent No.: US 9,424,896 B2
(45) Date of Patent: Aug. 23, 2016

(54) METHOD AND SYSTEM FOR FAST INITIALIZATION OF A MEMORY UNIT

(75) Inventors: Cas Groot, Antwerp (BE); Maurits Storms, Best (NL)

(73) Assignee: NXP B.V., Eindhoven (NL)

( * ) Notice: Subject to any disclaimer, the term of this patent is extended or adjusted under 35 U.S.C. 154(b) by 742 days.

(21) Appl. No.: 13/531,297

(22) Filed: Jun. 22, 2012

(65) Prior Publication Data

US 2013/0346733 A1 Dec. 26, 2013

(51) Int. Cl.
| | | |
|---|---|---|
| G06F 9/00 | (2006.01) | |
| G11C 7/20 | (2006.01) | |
| G11C 16/20 | (2006.01) | |
| G06F 3/06 | (2006.01) | |
| G06F 15/177 | (2006.01) | |
| G06F 1/32 | (2006.01) | |
| G06F 11/14 | (2006.01) | |
| G06F 12/06 | (2006.01) | |

(52) U.S. Cl.
CPC ............ *G11C 7/20* (2013.01); *G11C 16/20* (2013.01); *G06F 1/3275* (2013.01); *G06F 3/065* (2013.01); *G06F 3/0632* (2013.01); *G06F 11/1402* (2013.01); *G06F 12/0646* (2013.01); *G06F 15/177* (2013.01)

(58) Field of Classification Search
CPC ... G06F 3/065; G06F 1/3275; G06F 11/1402; G06F 12/0646; G06F 15/177; G06F 3/0632
USPC .......................................................... 713/1
See application file for complete search history.

(56) References Cited

U.S. PATENT DOCUMENTS

| | | | |
|---|---|---|---|
| 5,974,528 A | 10/1999 | Tsai et al. | |
| 6,115,307 A * | 9/2000 | Casper ........................ | 365/202 |
| 6,230,274 B1 * | 5/2001 | Stevens et al. ............... | 713/320 |
| 6,477,090 B2 | 11/2002 | Yamaki et al. | |
| 6,510,488 B2 | 1/2003 | Lasser | |
| 7,551,488 B2 | 6/2009 | Tanikawa et al. | |
| 7,796,441 B2 | 9/2010 | Kang et al. | |
| 8,656,199 B2 * | 2/2014 | Cho ........................... | G06F 1/32 711/100 |
| 2004/0008071 A1 | 1/2004 | Ko et al. | |
| 2004/0051574 A1 | 3/2004 | Ko et al. | |
| 2008/0126711 A1 * | 5/2008 | Hobson et al. ............... | 711/132 |
| 2008/0151654 A1 | 6/2008 | Allan et al. | |

(Continued)

FOREIGN PATENT DOCUMENTS

EP 1107121 A2 6/2001

OTHER PUBLICATIONS

Mahmoodi-Meimand et al., Data-Retention Flip-Flops for Power-Down Applications, 2004, IEEE.*
Ogura, T., et al.; "A Highly reliable logic NVM 'eCFlash (embedded CMOS Flash)' Utilizing Differential Sense-Latch Cell with Charge-Trapping Storage"; IEEE; 2008; p. 79-82.

(Continued)

*Primary Examiner* — Xuxing Chen

(57) ABSTRACT

Embodiments of a method for operating a computer system are disclosed. In one embodiment, the memory unit has a non-volatile memory array and processing logic and the non-volatile memory array stores initialization data that is used by the processing logic to perform input/output operations of the memory unit. The method involves storing the initialization data in retention registers within the memory unit, wherein the retention registers are separate from the non-volatile memory array and retain data while the memory unit is power gated, using the stored initialization data in the retention registers to initialize the memory unit upon exiting the power gating.

12 Claims, 9 Drawing Sheets

(56) References Cited

U.S. PATENT DOCUMENTS

| | | | |
|---|---|---|---|
| 2008/0239809 A1 | 10/2008 | Chae et al. | |
| 2009/0190402 A1 | 7/2009 | Hsu et al. | |
| 2011/0145306 A1 | 6/2011 | Boyd et al. | |
| 2012/0023349 A1* | 1/2012 | Machida et al. | 713/320 |
| 2012/0117311 A1* | 5/2012 | Hong | 711/103 |
| 2013/0282957 A1* | 10/2013 | Mylly | G06F 12/0223 711/103 |
| 2013/0339589 A1* | 12/2013 | Qawami et al. | 711/103 |

OTHER PUBLICATIONS

Panic, Goran, et al.; "Architecture of a Power-Gated Wireless Sensor Node"; 11th Euromicro Conference on Digital System Design Architectures, Methods and Tools; IEEE; 2008; p. 844-849.

Yang, Sheng, et al.; "Scan Based Methodology for Reliable State Retention Power Gating Design"; EDAA; 2010; 6 pgs.

Extended European Search Report, 13172059.1, Sep. 12, 2013.

* cited by examiner

METHOD AND SYSTEM FOR FAST INITIALIZATION OF A MEMORY UNIT

Integrated circuit (IC) devices can be fabricated to include a microprocessor and embedded memory. For example, embedded flash memory is fabricated on a substrate along with a microprocessor unit and other supporting circuitry to produce a monolithic microcontroller or system-on-a-chip (SOC). These microcontrollers and SOC devices are often used in battery-powered electronic devices in which power conservation is vitally important.

One technique for conserving power in such IC devices is to "power gate" the embedded flash memory during a low-power or standby mode. Although power gating works well to conserve power, power gating causes internal input/output (I/O) processing settings of the embedded flash memory, such as trimming, redundancy, and security settings, to be lost when the power is gated. Upon wakeup of the embedded flash memory, initialization data must be repopulated within the I/O circuitry to initialize the embedded flash memory. Until the embedded flash memory is initialized, data stored in the memory is not available for use by the microprocessor.

Embodiments of a method for operating a computer system are disclosed. In one embodiment, the memory unit has a non-volatile memory array and processing logic and the non-volatile memory array stores initialization data that is used by the processing logic to perform input/output operations of the memory unit. The method involves storing the initialization data in retention registers within the memory unit, wherein the retention registers are separate from the non-volatile memory array and retain data while the memory unit is power gated, using the stored initialization data in the retention registers to initialize the memory unit upon exiting the power gating.

Embodiments of a memory unit are also disclosed. In one embodiment, a memory unit includes a non-volatile memory array, processing logic, retention registers, and a controller. The non-volatile memory array stores initialization data and the processing logic is configured to perform input/output operations of the memory unit. The processing logic includes volatile registers for storing the initialization data when the memory unit is in a normal operating mode. The retention registers are configured to store data even when the memory unit is power gated from a power source. The controller is configured to store the initialization data in the retention registers and to populate the volatile registers of the processing logic using the initialization data from the retention registers upon transition from a low power mode to the normal operating mode.

Other aspects and advantages of embodiments in accordance with the invention will become apparent from the following detailed description, taken in conjunction with the accompanying drawings, illustrated by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
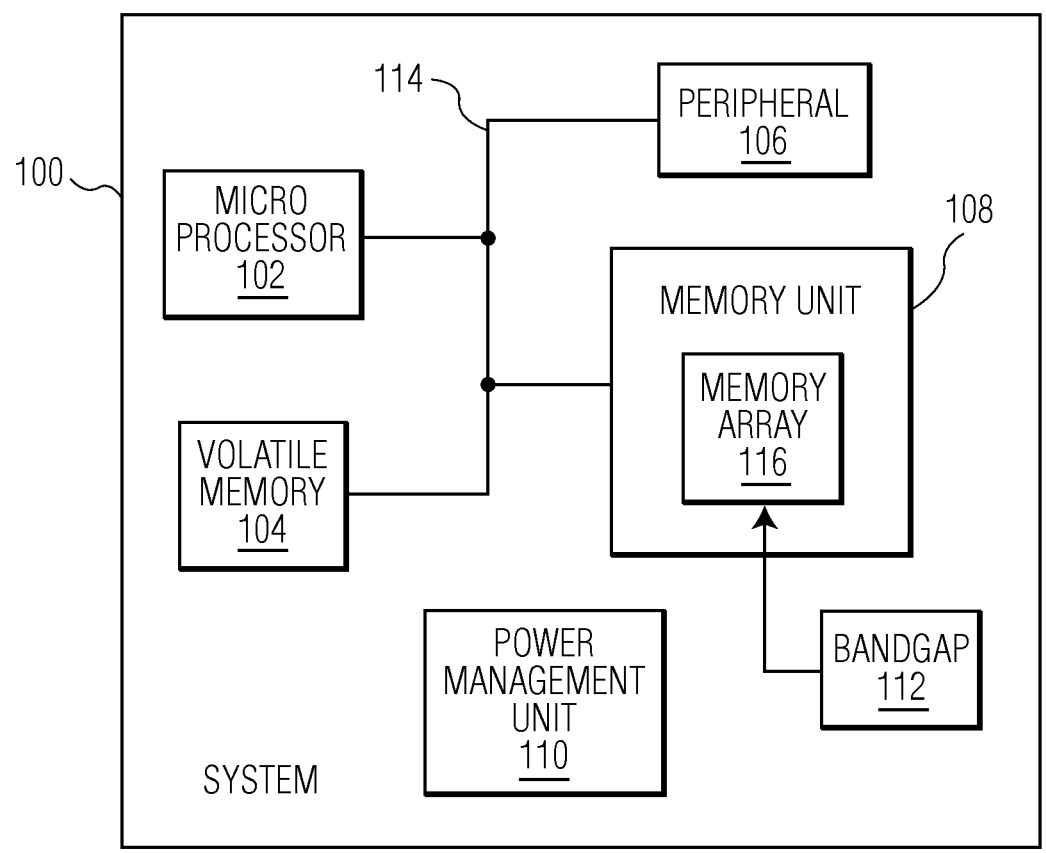
FIG. 1 depicts an embodiment of a computer system that includes a microprocessor, volatile memory, a peripheral, a memory unit, a power management unit, and a band gap.

FIG. 1 depicts an embodiment of a computer system 100 that includes a microprocessor 102, volatile memory 104, a peripheral 106, a memory unit 108, a power management unit 110, and a band gap 112. As illustrated in FIG. 1, the microprocessor, the volatile memory, the peripheral, and the memory unit are connected by a system bus 114 that serves as a data pathway to exchange digital data. In an embodiment, the computer system is a microcontroller for use in applications such as e-metering, hearing aids, wireless sensor networks, or mobile devices. Other uses of the computer system are possible.

In an embodiment, the microprocessor 102 is a micro instruction processor, also referred to as a central processing unit (CPU), as is known in the field and the volatile memory 104 is a memory system such as random access memory (RAM) that provides volatile memory for the computer system 100, e.g., memory that does not retain its stored data upon power down. In an embodiment, the microprocessor executes instructions that are stored in the memory unit 108. The peripheral 106 may include a device such as an analog signal processor, a touch screen controller, an I/O port, a speaker, or any other logic circuit that processes digital data communicated via the system bus. Although a single peripheral is depicted in FIG. 1, the computer system may include more than one peripheral. The memory unit is a non-volatile memory system that includes a memory array 116 to provide non-volatile memory to the computer system, e.g., memory such as flash memory that retains its stored data upon power down. Although the memory unit is a non-volatile memory system, the memory unit does include some volatile registers in the processing circuitry that support data I/O operations. The power management unit 110 manages the distribution of electrical power to the microprocessor, the volatile memory, the peripheral, and the memory unit. In a working system, the power unit is connected to a power source such as a battery.

The bandgap is an element that provides a reference signal, e.g., a reference voltage and/or reference current to the memory unit. In an embodiment, a bandgap circuit may be internal to the memory unit. In other embodiments, bandgap circuits are external to the memory unit and a reference signal is provided to the memory unit through an analog pin.

In an embodiment, all of the elements of the computer system 100 of FIG. 1 are fabricated on a single substrate, e.g., on a single silicon semiconductor substrate. IC devices with such a combination of functional units are often referred to as SOC devices. In such SOC devices, each functional unit is often referred to as an intellectual property (IP) block and the memory unit 108 is often referred to as "embedded" memory. In other embodiments, one or more of the functional units may be fabricated on a separate substrate and packaged together with the other functional units as a single packaged IC component. For example, multiple IC dies may be packaged into a multi-die package as is known in the field.

A computer system such as the computer system 100 depicted in FIG. 1 is often part of a battery operated electronic device such as a smart phone, a pad computer, a remote sensor, or various other wireless devices. In battery-operated devices, power conservation is a high priority and various techniques have been implemented to conserve power. One known technique for conserving power is "power gating." Power gating involves using a power switch to gate off a particular IP block from the power source, e.g., to cut off the transmission of electrical power from the battery. For example, the memory unit 108 (or a portion of the memory unit) can be power gated during times when the computer system is in a standby or a low-power mode. Power gating of the memory unit prevents power loss from voltage or current leakage at the memory unit and therefore enhances power conservation. However, power gating the memory unit typically causes the registers of the I/O processing logic to lose their stored data. In particular, any trimming, redundancy, and/or security data held in registers of the memory unit's processing logic is lost when the memory unit is power gated. When the computer system transitions from a low power mode to a normal operation mode, the power gate is opened (e.g., a power switch is closed) to allow power to flow back to the power gated IP block.

When the computer system 100 returns to a normal operating mode and the memory unit 108 is no longer power gated, the initialization data must be read from the memory array 116 and reloaded into the registers of the I/O processing circuitry before I/O operations between the memory unit and the microprocessor 102 can begin. Reading the initialization data from the memory array is a time-consuming process that adds to the time required to wake up the computer system, e.g., to transition the computer system from a low-power mode to a normal operating mode.

In an embodiment in accordance with the invention, the memory unit 108 is fabricated to include retention registers that are separate from the memory array and that can store the initialization data even when the memory unit is power gated. For example, the retention registers store the trimming data, redundancy data, and/or security data that is used to initialize the memory unit. When the computer system 100 transitions from a low-power mode to a normal operating mode, the initialization data used to populate the I/O processing logic is read from the retention registers instead of from the memory array, which as is explained below, is a much faster operation, resulting in a faster initialization of the memory unit and a faster overall wake up time for the computer system.

Figure 2:
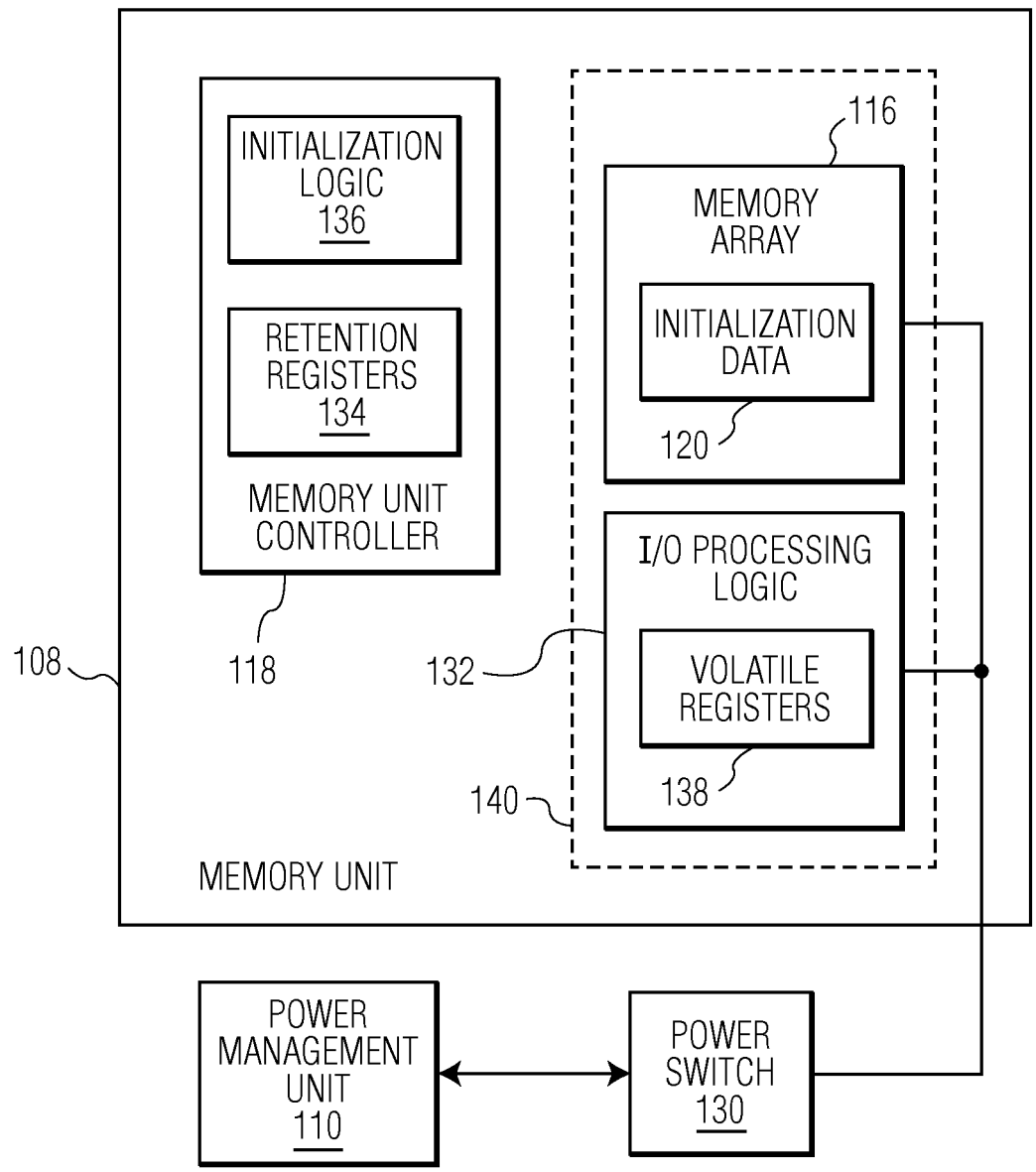
FIG. 2 depicts an expanded view of the memory unit of FIG. 1 in which the memory unit is configured to support rapid transition from a low-power mode to a normal operating mode.

FIG. 2 depicts an expanded view of the memory unit 108 of FIG. 1 in which the memory unit is configured to support rapid transition from a low-power mode to a normal operating mode. The memory unit includes the memory array 116 and a memory unit controller 118. The memory array is an array of memory cells such as flash memory cells or electrically erasable programmable read only memory (EEPROM) cells. As depicted in FIG. 2, the memory array stores initialization data 120 that is used by the memory unit controller to support the reading of data from the memory array and the writing of data to the memory array. In an embodiment, the initialization data is stored in an index row or index sector of the memory array and includes trimming data, redundancy data, and security data.

The memory unit also includes I/O processing logic 132 that is configured to support read operations from the memory array 116 and write operations to the memory array and may include, for example, word line repair logic, bit line repair logic, word decoders, bit decoders, and access control logic. The I/O processing logic also includes volatile registers 138, which store the initialization data for use during I/O processing.

In an embodiment, the trimming data specifies voltage and/or current information used by the word line repair circuits, the bit line repair circuits, the word decoders, and/or the bit decoders of the I/O processing logic. For example, the trimming data specifies adjustments that should be made to the reference voltage and/or the reference current to meet desired specifications.

In an embodiment, the redundancy data specifies repair addresses that are used to identify defective memory cells. For example, the redundancy data remaps defective memory cells to other specified memory cells, often referred to as "redundant" cells.

In an embodiment, the security data specifies, for example, access codes and encryption information. Additionally, security data may specify access limitations, e.g., the security data may define certain memory segments as read only.

To implement trimming, redundancy, and security functions, the volatile registers 138 within the I/O processing logic 132 are populated with the initialization data. For example, trimming data is populated in the volatile registers, e.g., latch circuits, to adjust the reference voltage, redundancy data is populated within volatile registers, e.g., repair logic to remap memory cells, and security data is populated within the volatile registers, e.g., access control logic to set memory access rules.

In the design of SOC devices, the memory array 116 and I/O processing logic 132 are often pre-designed by an outside vendor and provided to an SOC device designer as an IP block. In FIG. 2, a memory IP block that includes the memory array 116 and the I/O processing logic 132 is indicated by dashed line box 140. When using an "off-the-shelf" or pre-designed IP block, it is difficult if not impossible to modify the IP block. As is described in more detail below, retention registers, which are typically outside of the memory IP block, are used to enable fast memory unit initialization.

The initialization logic 136 and retention registers 134 of the memory unit controller 118 support the implementation of an initialization technique that enables fast initialization of the power gated memory unit and thus more rapid wake up of the entire computer system. In an embodiment, the retention registers are flip-flops that can retain digital data even when the memory unit 108 is power gated from the power management unit 110. As illustrated in FIG. 2, the retention registers are separate from the memory IP block 140, e.g., the retention registers are not physically part of the memory array or the I/O processing logic. The retention registers are used to store timing, redundancy, and/or security data, which is then used to initialize the memory unit, as is described in more detail below. The initialization logic can be a combination of hardware, software, and/or firmware that is configured to manage the storing of initialization data in the retention registers and the populating of the volatile registers 138 of the I/O processing logic 132 upon transition of the memory unit from a low-power mode to a normal operating mode. In the embodiment of FIG. 2, only the memory IP block 140 of the memory unit is power gated. In this case, power gating the memory unit 108 involves power gating only the memory IP block 140. However, in other embodiments, the memory unit controller 118 of the memory unit is also power gated. In such a case, the retention registers 134 may have an external power source that is not power gated or the retention registers may be configured as non-volatile memory registers, e.g., state retention flip-flops. In still another embodiment, it is possible that the state retention registers could be implemented within the memory IP block 140.

The power switch 130 functions as a digital switch that connects the power management unit 110 to the memory unit 108 in a normal operating mode and disconnects or "gates" the power management unit from the memory unit in a low-power mode. For example, in a normal operating mode, the computer system 100 performs the primary functions for which the computer system was designed, e.g., microcontroller functions, and in a low power mode, the computer system performs a limited set of operations, such as a low power sensing operation or the computer system simply waits for an input signal that triggers a wake up. In an embodiment, the power switch controls power to the memory IP block 140, that is, the memory IP block can be power gated. The power switch is typically controlled by an input from the power management unit but can be controlled by an input from a different functional unit such as the microprocessor 102. In an embodiment the power switch is implemented as a PMOS transistor or as an NMOS transistor, although other embodiments of the power switch are possible.

A description of a conventional memory unit initialization technique is described below with reference to FIGS. 3A and 3B and descriptions of initialization techniques in accordance with embodiments of the invention are described below with reference to FIG. 4A-5B.

A conventional memory unit initialization process is now described with reference to FIGS. 3A and 3B. FIG. 3A depicts a sequence of specific initialization steps that are implemented before a memory unit is fully operational, e.g., ready for data to be read from the memory unit or written to the memory unit. In a first step (identified as "reset"), a reset pulse is applied to the processing circuitry in the memory IP block 140 to ensure that all of the internal circuits are completely discharged. As illustrated in FIG. 3A, the reset pulse takes approximately 60% of the entire time required to complete the memory unit wakeup process. In parallel with the reset pulse, in a step identified as "internal voltages", internal voltages of elements of the I/O processing logic are allowed to stabilize. As shown in FIG. 3A, this process takes approximately 6% of the entire time required to complete the memory unit initialization process and is done in parallel with the internal voltage stabilization.

In a next step (identified as "trimming"), trimming data is read from the memory array and then populated into the appropriate volatile registers of the I/O processing logic. As illustrated in FIG. 3A, the initialization operation related to setting the trimming data takes approximately 24% of the entire time required to complete the memory unit initialization process. In a next step (identified as "redundancy"), redundancy data is read from the memory array and then populated into the appropriate volatile registers of the I/O processing logic. As illustrated in FIG. 3A, the initialization operation related to setting the redundancy data takes approximately 11% of the entire time required to complete the memory unit initialization process. Without taking security precautions into account, data can be read from the memory unit once the trimming and redundancy initialization operations are completed. In a next step (identified as "security"), security data is read from the memory array and then populated into the appropriate volatile registers of the I/O processing logic. As illustrated in FIG. 3A, the initialization operation related to setting the security data takes approximately 5% of the entire time required to complete the memory unit initialization process. FIG. 3B is a summary of the time required for each step of the initialization process relative to the entire time required to complete the memory unit initialization process.

Figure 3A:
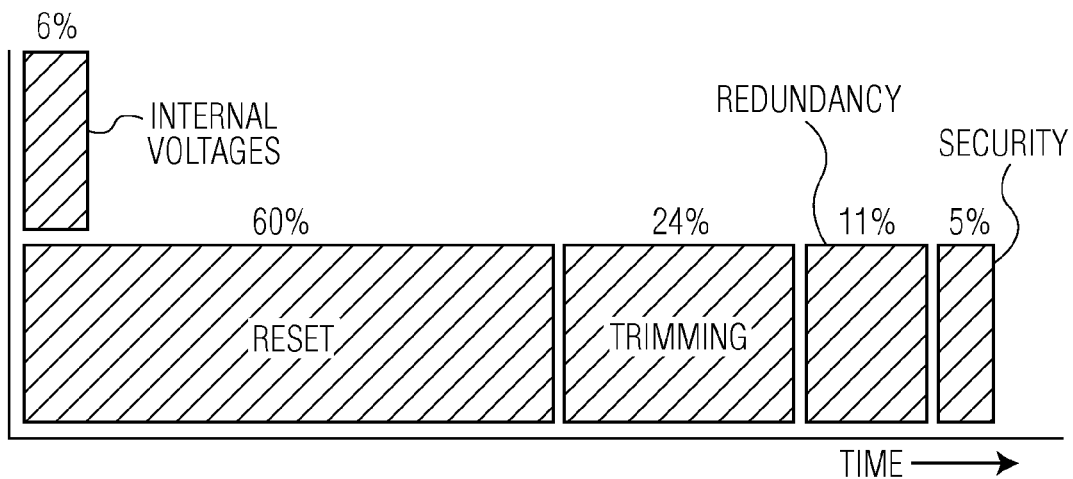
FIGS. 3A and 3B illustrate a timeline of a conventional memory unit initialization process.
Figure 3B:
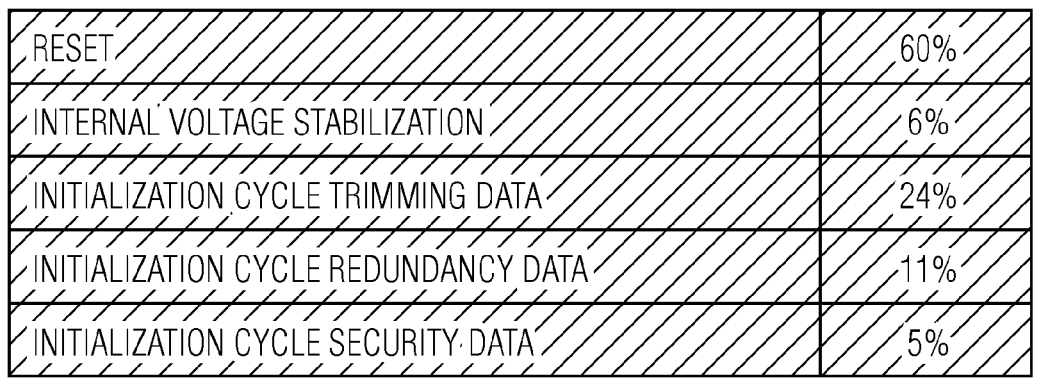

As shown in FIGS. 3A and 3B, a large portion of the initialization time is attributed to the reset and trimming operations. In particular, these operations take approximately 84% of the entire time required to complete the memory unit initialization process. In order to significantly reduce the overall initialization time, it is advantageous to reduce the time required to complete the reset and trimming operations. In accordance with an embodiment of the invention, the retention registers 134 are used to store trimming data and the stored trimming data is used to populate the volatile registers 138 of the I/O processing logic 132 when the computer system 100 is requested to transition from a low power mode to a normal operating mode. Because the trimming data is read from the retention registers instead of from the memory array 116, only a very short pulse reset is required and the time required to read the initialization data is greatly reduced. As explained above, in a conventional initialization process, the trimming, redundancy, and security initialization operations all require initialization data to be read from the memory array. The balance between storing initialization data in the retention registers and the corresponding reduction in the initialization time is described below with reference to FIGS. 4A-5B.

Figure 4A:
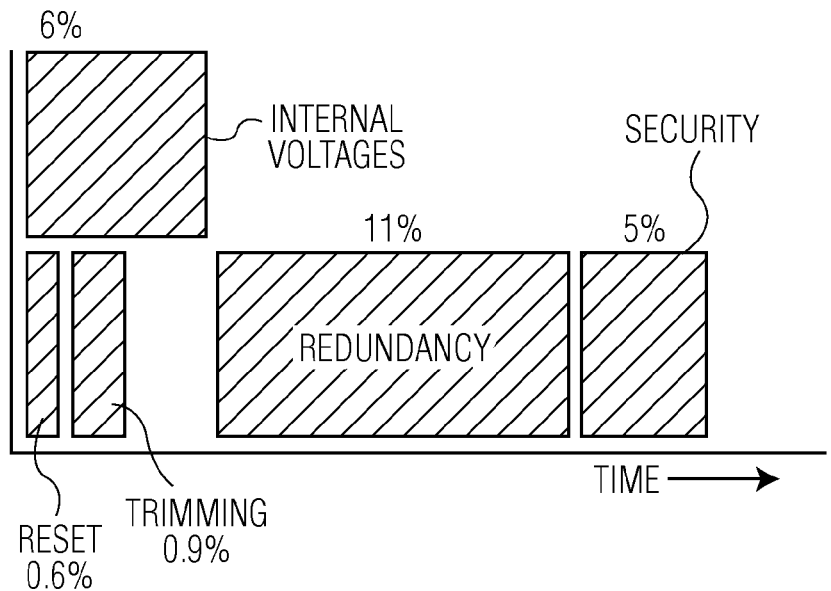
FIGS. 4A and 4B illustrate a timeline of a memory unit initialization process in which trimming data is stored in retention registers for use during the memory unit initialization process.
Figure 4B:
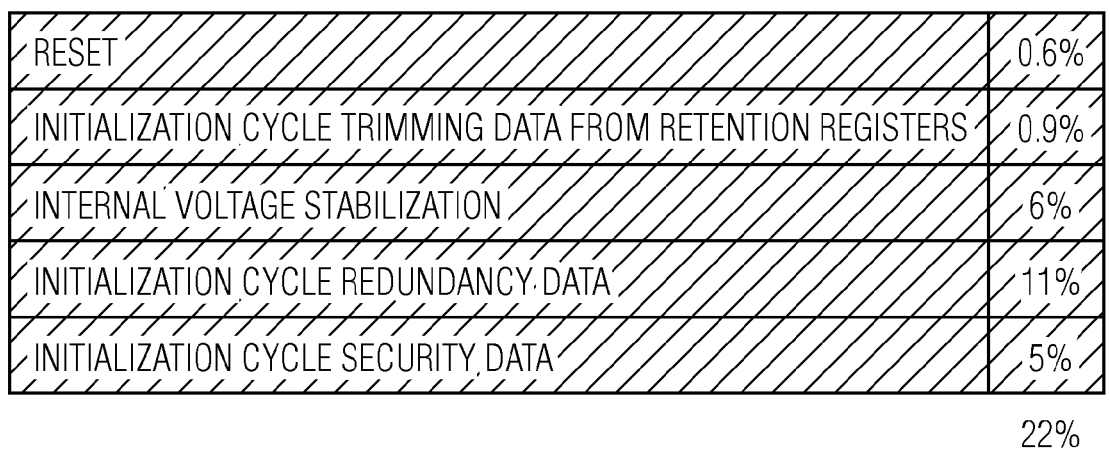

In an embodiment, only the trimming data is stored in the retention registers for use during the memory unit initialization process. FIGS. 4A and 4B illustrate a timeline of a memory unit initialization process in which trimming data is stored in the retention registers 134 for use during the memory unit initialization process. With reference to FIGS. 4A and 4B, the time required for the reset pulse can be reduced to approximately 0.6% of the entire initialization time and the operation related to setting the trimming data can be reduced to approximately 0.9% of the entire initialization time. The internal voltages of the I/O processing logic 132 still have to be stabilized but this can be done in parallel with the reset pulse and the setting of the trimming data. Since the duration of the voltage stabilization operation is longer than the combined time of the reset and trimming operations, the time required for voltage stabilization is the controlling time period and the initialization operation related to setting the redundancy data does not start until after the internal voltages are stabilized. Because only the trimming data is stored in the retention registers, in subsequent steps, the redundancy data and the security data must be read from the memory array 116 and populated in the registers of the I/O processing logic as described above with reference to FIG. 3A. With the substantial reductions in the time required for pulse reset and the time required to set the trimming data, the total initialization time of the process described with reference to FIG. 4A is approximately 22% of the entire time required for a conventional initialization process as described with reference to FIG. 3A.

Figures 5A, 5B:
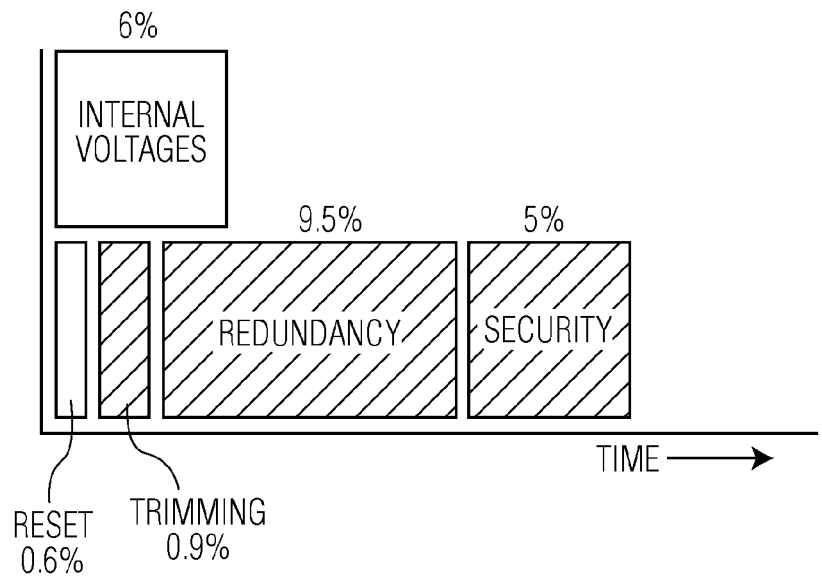
FIGS. 5A and 5B illustrate a timeline of a memory unit initialization process in which both trimming data and redundancy data are stored in retention registers for use during the memory unit initialization process.

In another embodiment, both the trimming data and the redundancy data are stored in the retention registers 134 and used to transition the computer system 100 from a low power mode to a normal operating mode. With reference to FIG. 5A, in the case that both the trimming data and the redundancy data are stored in the retention registers, the time required for the reset and trimming operations is reduced to approximately 0.6% and 0.9%, respectively, of the entire time of the conventional initialization process described with reference to FIG. 3A. Reading the redundancy data from the retention registers reduces the time required for the redundancy initialization operation to approximately 9.5% of the total time required. Although the 9.5% represents a relatively small reduction from the conventional 11%, a significant benefit of storing both the trimming and redundancy data in the retention registers is that the initialization operation related to the redundancy data can proceed in parallel with the stabilization of the internal voltages. Implementing the operations related to the trimming data and the redundancy data in parallel with the stabilization of the internal voltages is illustrated in the timeline of FIG. 5A. When the trimming and redundancy data are both stored in the retention registers, the total time for the initialization process is reduced to approximately 16% of the entire time required for a conventional initialization process as described with reference to FIG. 3A. As described above, read operations can commence once the volatile registers of the processing logic are populated with the redundancy data.

In order for the initialization data to be read from the retention registers 134, the initialization data must first be read from the memory array 116 and written to the retention registers. In an embodiment, reading the initialization data from the memory array and writing the initialization data to the retention registers occurs during a first initialization operation, for example, when the computer system transitions from an off state to an on state, often referred to as a "cold start." In an embodiment, a cold start occurs when the computer system transitions from an off state to a normal operating mode and a warm start occurs when the computer system transitions from a low-power or standby mode to a normal operating mode. In an embodiment, a warm start occurs after the memory unit 108 has been power gated. That is, the warm start occurs upon exiting the power gating, for example, when the power switch is closed so that electrical power is provided to the memory unit from a power source such as a battery. In a cold start, the initialization data is read from the memory array and programmed into the volatile registers 138 of the I/O processing logic 132. In addition to the initialization data being programmed into the volatile registers of the I/O processing logic, the desired portion of the read initialization data is also stored in the retention registers 134. In a warm start, some portion of the initialization data, which has previously been stored in the retention registers, is read from the retention registers instead of from the memory array.

Figure 6:
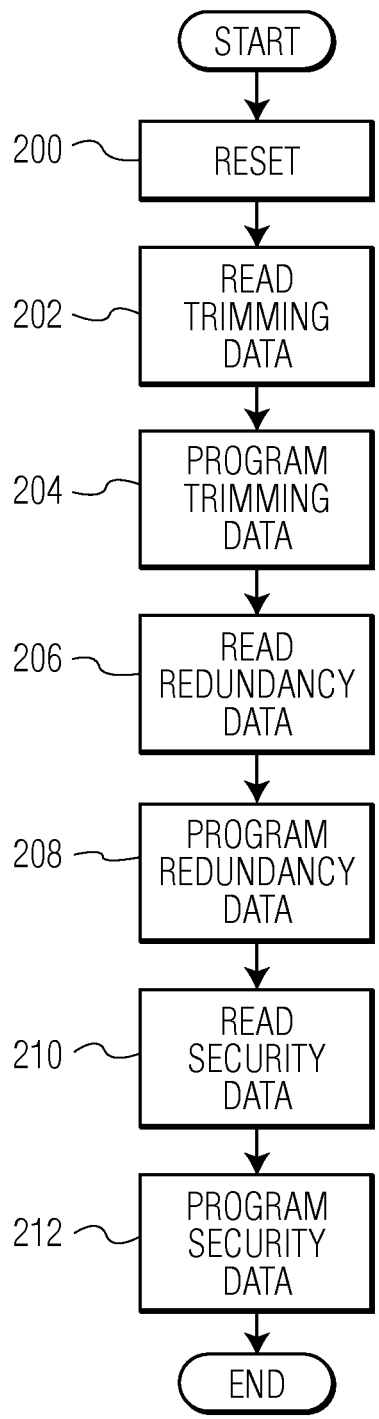
FIG. 6 is a process flow diagram of a conventional initialization operation as described above with reference to FIGS. 3A and 3B.

FIG. 6 is a process flow diagram of a conventional initialization operation as described above with reference to FIG. 3A. Once the initialization process is triggered to start, at block 200, a reset operation is performed, e.g., a reset pulse is applied. At block 202, the trimming data is read from the memory array and at block 204, the trimming data is programmed into the volatile registers of the I/O processing logic. At block 206, the redundancy data is read from the memory array and at block 208, the redundancy data is programmed into the volatile registers of the I/O processing logic. At block 210, the security data is read from the memory array and at block 212, the security data is programmed into the volatile registers of the I/O processing logic, which ends the initialization process.

Figure 7:
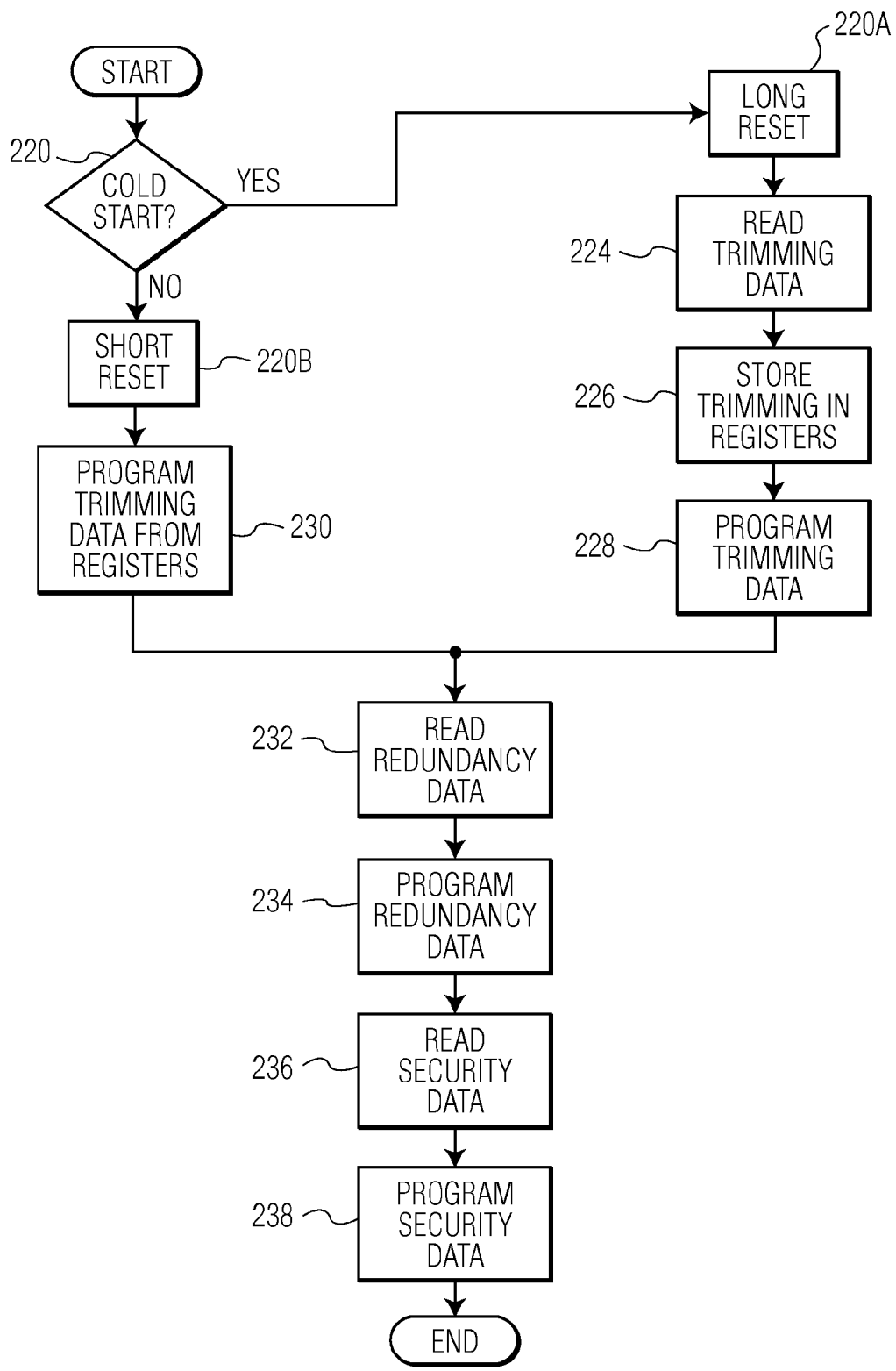
FIG. 7 is a process flow diagram of an initialization operation that utilizes retention registers to store trimming data as is described above with reference to FIGS. 4A and 4B.

FIG. 7 is a process flow diagram of an initialization operation that utilizes retention registers to store trimming data as is described above with reference to FIGS. 4A and 4B. Once the initialization process is triggered to start, at decision point 220, it is determined whether or not this is the first initialization process. For example, is the initialization process part of a cold start or a warm start. If the initialization process is part of a cold start (such that no initialization data is stored in the retention registers), at block 220A, a long reset operation is performed and at block 224, trimming data is read from the memory array. At block 226, the trimming data is stored in the retention registers 134 for use in a subsequent initialization process. At block 228, the trimming data is programmed into the volatile registers 138 of the I/O processing logic 132. If the initialization process is part of a warm start that involves removing a power gate (such that the trimming data was previously stored in the retention registers), then at block 220B, a short reset pulse operation is performed and at block 230, the trimming data is read from the retention registers instead of from the memory array and used to populate the volatile registers of the I/O processing logic. Once the volatile registers of the I/O processing logic have been populated with the trimming data, at block 232, redundancy data is read from the memory array and at block 234, the redundancy data is programmed into the volatile registers of the I/O processing logic. At block 236, the security data is read from the memory array and at block 238, security data is programmed into the volatile registers of the I/O processing logic, which ends the initialization process. The time savings of this initialization process is described with reference to FIGS. 4A and 4B.

Figure 8:
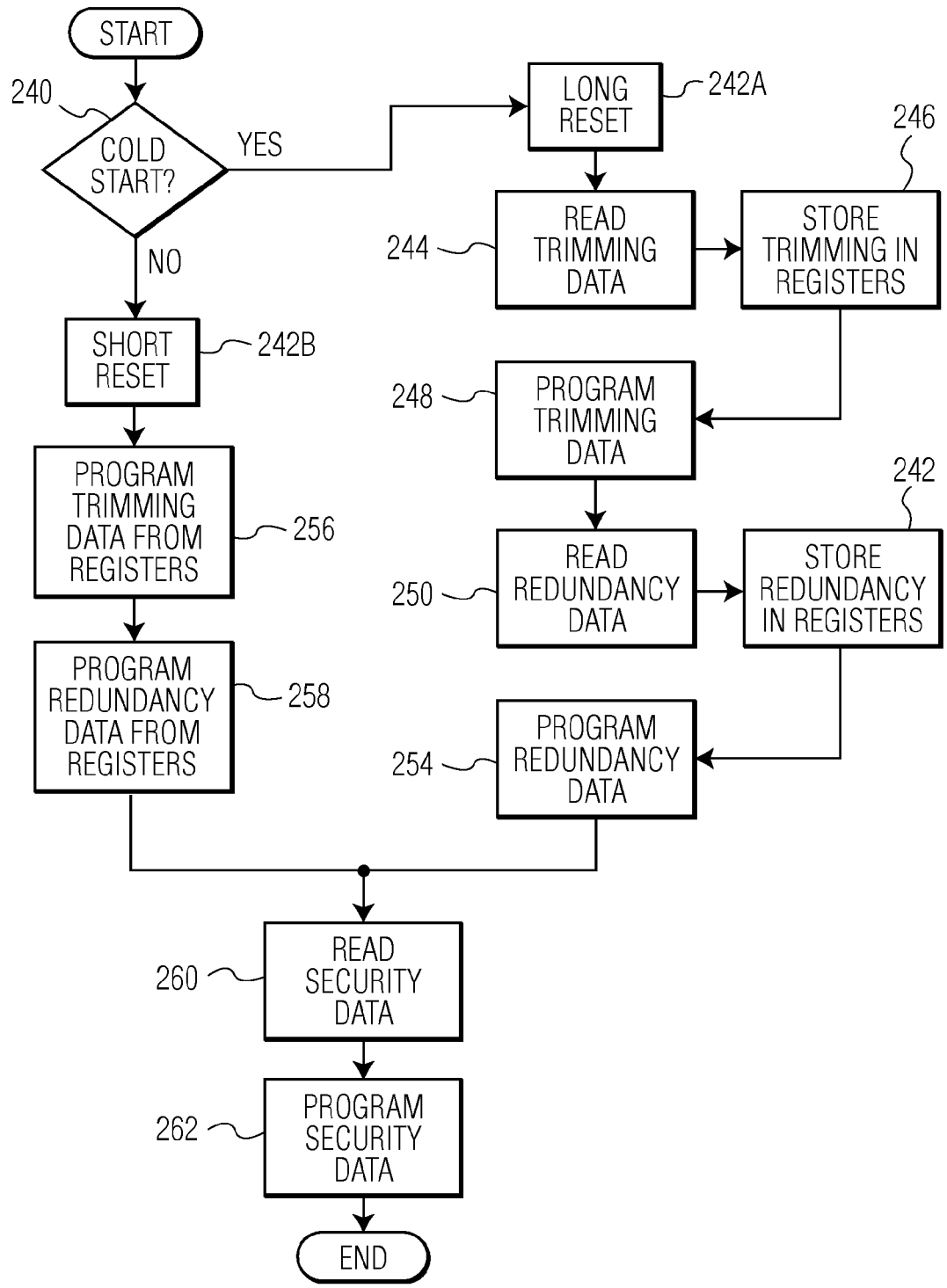
FIG. 8 is a process flow diagram of an initialization operation that utilizes retention registers to store trimming data along with redundancy data as is described above with reference to FIGS. 5A and 5B.

FIG. 8 is a process flow diagram of an initialization operation that utilizes retention registers to store trimming data along with redundancy data as is described above with reference to FIGS. 5A and 5B. Once the initialization process is triggered to start, at decision point 240, it is determined whether or not this is the first initialization process. For example, is the initialization process part of a cold start or a warm start. If the initialization process is part of a cold start, at block 242A, a long reset operation is performed and at block 244, trimming data is read from the memory array. At block 246, the trimming data is stored in the retention registers 134 for use in a subsequent initialization process. At block 248, the trimming data is programmed into the volatile registers 138 of the I/O processing logic 132. Additionally, if the initialization process is part of a cold start, at block 250, redundancy data is read from the memory array and at block 252, the redundancy data is stored in the retention registers for use in a subsequent initialization process. At block 254, the redundancy data is programmed into the volatile registers of the I/O processing logic. If the initialization process is part of a warm start that involves opening the power gate (such that the trimming and redundancy data have previously been stored in the retention registers), then at block 242B, a short reset operation is performed and at block 256, the trimming data is read from the retention registers instead of from the memory array and the trimming data in the retention registers is used to populate the volatile registers of the I/O processing logic and, at block 258, redundancy data is read from the retention registers instead of from the memory array and the redundancy data in the retention registers is used to populate the volatile registers of the I/O processing logic. Once the volatile registers of the I/O processing logic have been populated with the trimming data and the redundancy data, at block 260, security data is read from the memory array and at block 262, the security data is programmed into the volatile registers of the I/O processing logic, which ends the initialization process. The time savings of this initialization process is described with reference to FIGS. 5A and 5B.

It is also possible to add enough retention registers 134 to store the security data. However, because the initialization operations related to the security data represents only approximately 5% of the entire wake up time, the reduction in initialization time must be weighed against the increases area needed on the IC device for additional retention registers.

As described above, retention registers 134 are added to the controller 118 of the memory unit 108 to enable fast memory unit initialization. The number of retention registers required depends on the amount of data that is to be stored and each retention register requires a certain amount if physical space on the IC device. The additional area for a typical flash controller IP is based on the area required for the retention registers. An example of the area required for retention registers (as a percentage of the total available area on the controller) is provided below in Table 1.

TABLE 1

| Flash controller IP property | Number of nd2 equivalent cells | Area overhead for retention option | |
|---|---|---|---|
| | | Trimming data | Trimming and redundancy data |
| 128 bit bus | 28 k | 0.4% | 8.1% |
| 256 bit bus | 42 k | 0.3% | 5.4% |

In an embodiment, if the memory unit controller 118 and the memory array 116 are fabricated on the same IC device, the physical area required for the retention registers is a very small percentage of the overall area of the IC device. For example, Table 2 provides a summary comparison of how wake up times (as a percentage of the total wake up time using a conventional initialization process) are affected when utilizing retention registers for trimming data or trimming data and redundancy data relative to no retention registers. Table 2 also indicates the area overhead required for each scenario.

TABLE 2

| | Retention option | | |
|---|---|---|---|
| Wake-up operation | Regular Sequence | Trimming retention | Trimming and redundancy retention |
| Wake-up read | 94.6% | 17.3% | 11% |
| Wake-up write | 100% | 22.6% | 16.4% |
| Area required for retention registers (as % of the total area of the controller) | 0% | 0.3% | 5.4% |

Figure 9:
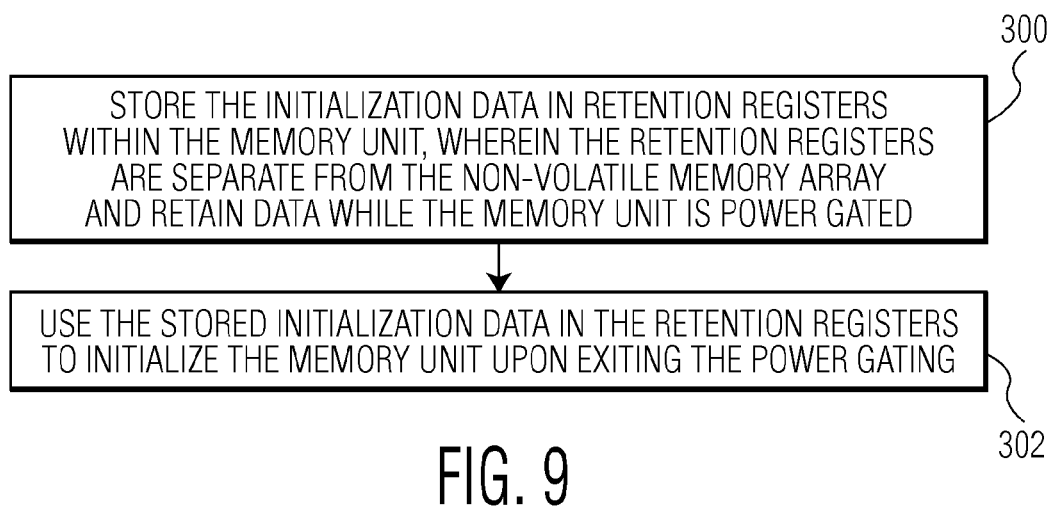
FIG. 9 is a process flow diagram of an embodiment of a method for operating a memory unit of a computer system.

An embodiment of a method for operating a memory unit of a computer system is depicted in FIG. 9. The memory unit has a non-volatile memory array and processing logic and the non-volatile memory array stores initialization data that is used by the processing logic to perform input/output operations of the memory unit. According to the method, at block 300, initialization data is stored in retention registers within the memory unit, wherein the retention registers are separate from the non-volatile memory array and retain data while the memory unit is power gated. At block 302, the stored initialization data in the retention registers is used to initialize the memory unit upon exiting the power gating.

Figure 10:
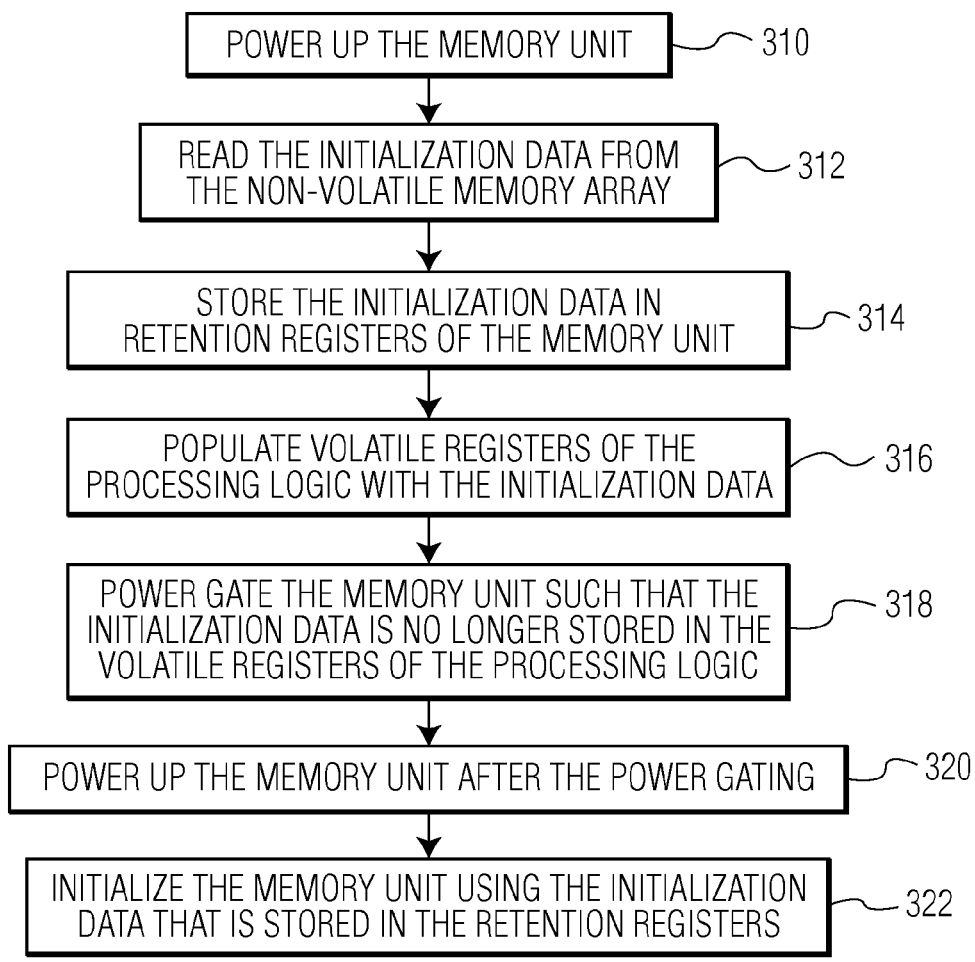
FIG. 10 is a process flow diagram of an embodiment of a method for operating a memory unit of a computer system.

Another embodiment of a method for operating a memory unit of a computer system is depicted in FIG. 10. The memory unit has a non-volatile memory array and processing logic and the non-volatile memory array stores initialization data that is used by the processing logic to perform input/output operations of the memory unit. According to the method, at block 310, the memory unit is powered up. At block 312, initialization data is read from the non-volatile memory array. At block 314, the initialization data is stored in retention registers of the memory unit. At block 316, volatile registers of the processing logic are populated with the initialization data. At block 318, the memory unit is power gated such that the initialization data is no longer stored in the volatile registers of the processing logic. At block 320, the memory unit is powered up after the power gating. At block 322, the memory unit is initialized using the initialization data that is stored in the retention registers.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of a computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method of operating a memory unit of a computer system, the memory unit having a non-volatile memory array and processing logic, wherein the non-volatile memory array stores initialization data that is used by the processing logic to perform input/output operations of the memory unit, the method comprising:
    storing the initialization data in retention registers within the memory unit, wherein the retention registers are separate from the non-volatile memory array and retain data while the memory unit is power gated; and
    using the stored initialization data in the retention registers to initialize the memory unit upon exiting the power gating and determining that this is not a cold start;
    wherein using the stored initialization data in the retention registers to initialize the memory unit upon exiting the power gating comprises populating volatile registers of the processing logic with the initialization data; and
    wherein the initialization data comprises trimming data, wherein the trimming data is stored in the retention registers and wherein the initialization data that is populated in the volatile registers of the processing logic from the retention registers includes the trimming data and the trimming data is used by the processing logic to perform input/output operations upon exiting the power gating.

2. The method of claim 1 wherein the initialization data comprises redundancy data, wherein using the stored initialization data in the retention registers to initialize the memory unit upon exiting the power gating comprises populating volatile registers of the processing logic with the redundancy data, wherein the redundancy data is stored in the retention registers and wherein the redundancy data that is populated in the volatile registers of the processing logic from the retention registers is used by the processing logic to perform input/output operations upon exiting the power gating.

3. The method of claim 1 wherein the initialization data comprises security data.

4. A method of operating a memory unit of a computer system, the memory unit having a non-volatile memory array and processing logic, wherein the non-volatile memory array stores trimming data that is used by the processing logic to perform input/output operations of the memory unit, the method comprising:
    powering up the memory unit;
    reading the trimming data from the non-volatile memory array;
    storing the trimming data in retention registers of the memory unit;
    populating volatile registers of the processing logic with the trimming data;
    power gating the memory unit such that the trimming data is no longer stored in the volatile registers of the processing logic;
    powering up the memory unit after the power gating;
    populating the volatile registers of the processing logic with the trimming data stored in the retention registers instead of with the trimming data stored in the non-volatile memory array;
    performing input/output operations using the trimming data populated in the volatile registers of the processing logic upon powering up the memory unit after the power gating.

5. The method of claim 4 wherein redundancy data is also stored in the retention registers and used to populate the volatile registers of the processing logic upon powering up the memory unit after the power gating.

6. A memory unit comprising:
    a non-volatile memory array, wherein the non-volatile memory array stores trimming data;
    processing logic configured to perform input/output operations of the memory unit, wherein the processing logic includes volatile registers for storing the trimming data when the memory unit is in a normal operating mode;
    retention registers configured to store data even when the memory unit is power gated from a power source;
    a controller configured to:
        store the trimming data in the retention registers; and
        populate the volatile registers of the processing logic using the trimming data from the retention registers upon transition from a low power mode to the normal operating mode.

7. The memory unit of claim 6 further comprising a power switch configured to power gate the memory unit from a power source.

8. The memory unit of claim 6 wherein memory unit input/output operations are performed in the normal operating mode and no memory unit input/output operations are performed in the low power mode.

9. A computer system comprising:
    a memory unit, the memory unit comprising:
        a non-volatile memory array, wherein the non-volatile memory array stores initialization data, wherein the initialization data comprises at least one of trimming data and redundancy data,
        processing logic configured to perform input/output operations of the memory unit, wherein the processing logic includes volatile registers for storing the initialization data when the memory unit is in a normal operating mode,
        retention registers configured to store data even when the memory unit is power gated from a power source, and
        a controller configured to:
            store the initialization data in the retention registers, and populate the volatile registers of the processing logic using the initialization data from the retention registers upon transition from a low power mode to the normal operating mode, wherein the volatile registers of the processing logic are populated using the initialization data from the retention registers instead of from the non-volatile memory array upon transition from a low power mode to a normal operating mode a microprocessor;

a data bus that connects the microprocessor to the memory unit;

a power management unit connected to provide power to the memory unit; and a power switch, in a power transmission path between the memory unit and the power management unit, configured to power gate the memory unit from the power management unit in a low power mode.

10. The computer system of claim 9 wherein the microprocessor and memory unit are fabricated on the same substrate.

11. The computer system of claim 9 wherein the microprocessor and memory unit are fabricated on different substrates and packaged in a multi-die package.

12. The computer system of claim 9, wherein the initialization data is stored in the retention registers upon cold start of the computer system.

* * * * *